(12) United States Patent
Steinberg et al.

(10) Patent No.: US 6,964,804 B2
(45) Date of Patent: Nov. 15, 2005

(54) MICROMACHINED STRUCTURES MADE BY COMBINED WET AND DRY ETCHING

(75) Inventors: Dan A. Steinberg, Blacksburg, VA (US); Jasean Rasnake, Blacksburg, VA (US); David W. Sherrer, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 1 day.

(21) Appl. No.: 10/076,858

(22) Filed: Feb. 14, 2002

(65) Prior Publication Data

US 2003/0059622 A1 Mar. 27, 2003

(Under 37 CFR 1.47)

Related U.S. Application Data

(60) Provisional application No. 60/269,011, filed on Feb. 14, 2001, and provisional application No. 60/269,010, filed on Feb. 14, 2001.

(51) Int. Cl.[7] .............................. C23F 1/00; B32B 3/00
(52) U.S. Cl. .......................... 428/141; 428/446; 216/2; 216/39
(58) Field of Search ................................ 428/141, 446; 216/2, 39

(56) References Cited

U.S. PATENT DOCUMENTS

| | | |
|---|---|---|
| 4,021,097 A | 5/1977 | McMahon |
| 4,181,400 A | 1/1980 | Malsot et al. |
| 4,225,213 A | 9/1980 | McBride, Jr. et al. |
| 4,253,735 A | 3/1981 | Kawamura et al. |
| 4,362,367 A | 12/1982 | Hammer et al. |
| 4,411,057 A | 10/1983 | Duda et al. |
| 4,601,541 A | 7/1986 | Shaw et al. |
| 4,683,560 A | 7/1987 | Takeuchi et al. |
| 4,706,061 A | 11/1987 | Johnson |
| 4,784,721 A | 11/1988 | Holmen et al. |
| 4,812,002 A | 3/1989 | Kato et al. |
| 4,830,450 A | 5/1989 | Connell et al. |
| 4,837,129 A | 6/1989 | Frisch et al. |
| 4,945,400 A | 7/1990 | Blonder et al. |
| 5,024,500 A | 6/1991 | Stanley et al. |
| 5,095,386 A | 3/1992 | Scheibengraber |
| 5,135,590 A | 8/1992 | Basavanhally et al. |
| 5,281,301 A | 1/1994 | Basavanhally |
| 5,339,377 A | 8/1994 | Takahashi |
| 5,357,593 A | 10/1994 | Bossler |
| 5,381,231 A | 1/1995 | Tu |
| 5,384,872 A | 1/1995 | Jacobs-Cook et al. |

(Continued)

FOREIGN PATENT DOCUMENTS

WO    WO 03/0098139    1/2003

OTHER PUBLICATIONS

Marc Madou, "Fundametals of Microfabrication", CRC Press, pp. 174–178, 1997., (no month).

J. G. Fleming, "Combining the beat of bulk and surface micromaching using Si {111} substrates." SPIE vol. 3511, Sep. 1998, pp. 162–168.

J. Brugger, et al., "Self–aligned 3D shadow mask technique for petterning deeply recessed surfaces of micro–electo–mechanical systems devices." Sensors and Actuators 76 (1999) pp. 329–334.

*Primary Examiner*—Stephen Stein
(74) *Attorney, Agent, or Firm*—Jonathan D. Baskin

(57) ABSTRACT

A micromachined structure, comprising: a substarte; a first wet etched pit disposed in the substrate; a second wet etched pit disposed in the substrate, the second pit extending into the substrate a greater depth than the first pit; and a dry pit disposed between, and adjacent to, the first and second pits. Also disclosed is a micromachined substrate comprising: a wet etched pit; and a dry-etched hole disposed in the wet etched pit, wherein the dry hole extends through the substrate.

9 Claims, 22 Drawing Sheets

U.S. PATENT DOCUMENTS

| | | |
|---|---|---|
| 5,440,657 A | 8/1995 | Essert |
| 5,507,911 A * | 4/1996 | Greiff .................... 73/514.23 |
| 5,760,305 A | 6/1998 | Greiff |
| 5,781,675 A | 7/1998 | Tseng et al. |
| 5,844,723 A | 12/1998 | Snyder |
| 5,852,308 A * | 12/1998 | Wood ........................ 257/252 |
| 5,886,249 A * | 3/1999 | Bonne et al. .............. 73/24.02 |
| 5,896,481 A | 4/1999 | Beranek et al. |
| 5,911,021 A | 6/1999 | MacDonald et al. |
| 5,966,493 A | 10/1999 | Wagoner et al. |
| 6,023,546 A | 2/2000 | Tachigori |
| 6,088,168 A | 7/2000 | Snyder |
| 6,146,917 A * | 11/2000 | Zhang et al. ................. 438/51 |
| 6,212,320 B1 | 4/2001 | Rickman et al. |
| 6,428,053 B1 * | 8/2002 | Tai et al. ...................... 285/24 |
| 6,511,235 B2 | 1/2003 | Wu et al. |
| 6,548,371 B2 | 4/2003 | Fujimaki |
| 6,553,173 B1 | 4/2003 | Goto |
| 2003/0034438 A1 * | 2/2003 | Sherrer et al. .............. 250/216 |
| 2002/0067049 A1 | 4/2003 | Steomberg et al. |
| 2003/0067049 A1 | 4/2003 | Steinberg et al. |

\* cited by examiner

MICROMACHINED STRUCTURES MADE BY COMBINED WET AND DRY ETCHING

RELATED APPLICATIONS

The present application claims the benefit of priority from copending provisional parent applications 60/269,011 filed on Feb. 14, 2001 and 60/269,010 filed on Feb. 14, 2001 and which are hereby incorporated by reference.

FIELD OF THE INVENTION

The present invention relates generally to micromachining. More particularly, the present invention relates to a new method for combining directional ion etching and anisotropic wet etching. The present invention is particularly applicable to silicon micromachining.

BACKGROUND OF THE INVENTION

Silicon optical bench chips often have anisotropically etched grooves for holding optical fibers or other components. Also, SiOB chips can have dicing saw cuts that function as fiber stops, thereby providing passive longitudinal alignment for an optical fiber. Such optical bench chips are well known in the art.

In some cases, it is not desirable or practical to have dicing saw cuts. Particularly, dicing saw cuts can be undesirable because they typically must extend across an entire wafer. It would be an advance in the art to provide fiber stops in optical bench chips without requiring dicing saw cuts. Also, it would be an advance in the art of micromachining to provide a wider array of precision-made structures. Particularly, it would be advance to combine multiple micromachining techniques to provide unusual, useful structures.

SUMMARY OF THE INVENTION

The present invention provides novel micromachined structure, comprising: a substarte; a first wet etched pit disposed in the substrate; a second wet etched pit disposed in the substrate, the second pit extending into the substrate a greater depth than the first pit; and a dry pit disposed between, and adjacent to, the first and second pits. The present invention also provides a micromachined substrate comprising: a wet etched pit; and a dry-etched hole disposed in the wet etched pit, wherein the dry hole extends through the substrate.

In a further aspect of the present invention, a method for micromachining a substrate is provided, comprising: providing a hard mask on a selected portion of the substrate to provide a region of the substrate without a hard mask; removing a portion of the substrate adjacent the region without the hard mask using one or more of ultrasonic drilling, laser etching, sawing and electrochemical etching to provide a micromachined feature in the substrate; and wet etching the substrate to provide a wet etched feature adjacent to the micromachined feature.

BRIEF DESCRIPTION OF THE DRAWINGS

The foregoing summary and the following detailed description of the preferred embodiments of the present invention will be understood when read in conjunction with the appended drawings, in which:

FIGS. 22A–21E illustrate additional, optional steps for use with the method illustrated in FIGS. 21A–21H;

DETAILED DESCRIPTION

Figure 1:
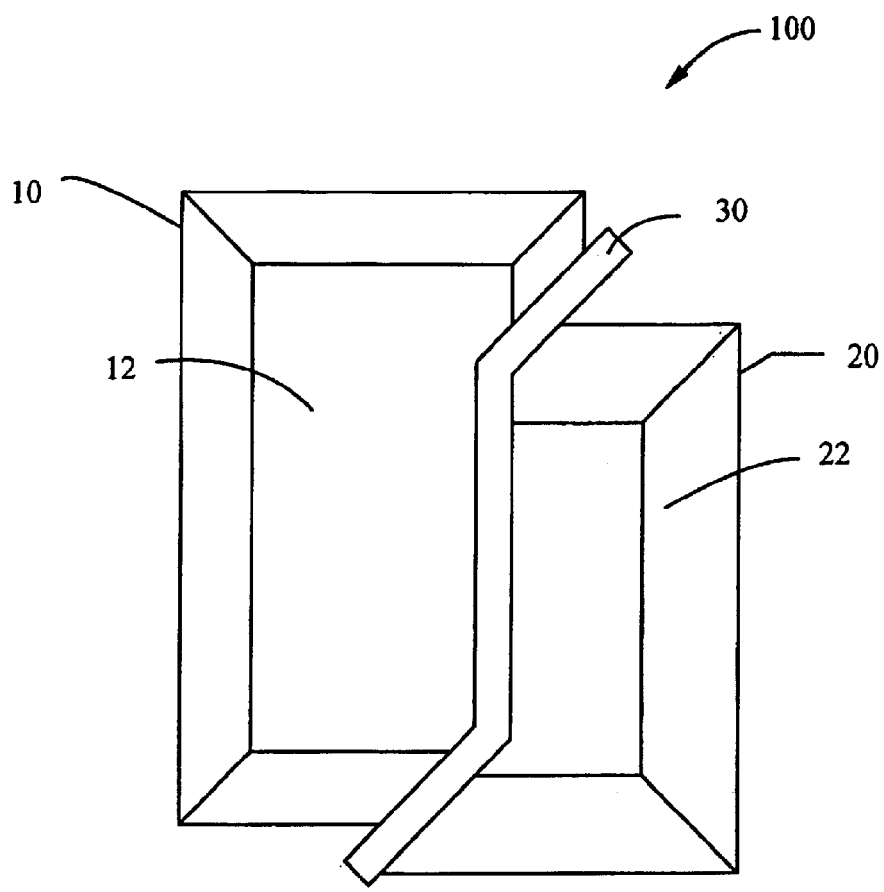
FIG. 1 illustrates a top view of an exemplary structure in accordance with the present invention having two flat, planar surfaces that are both parallel with the substrate surface and a dry pit disposed between the planar surfaces.
Figure 2:
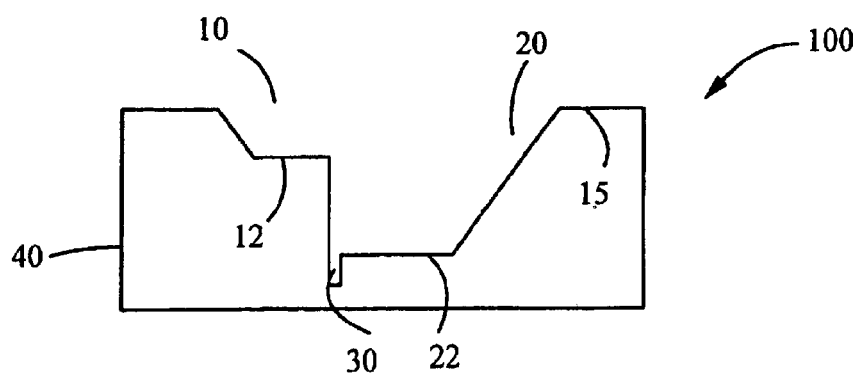
FIG. 2 illustrates a cross-sectional view of the structure of FIG. 1.

The present invention provides novel micromachined structures made by combined wet/dry etching. The structures can be used in a variety of micromachined devices, including micro-optical submounts and the like. For example, referring now to the figures, wherein like elements are numbered alike throughout, FIGS. 1 and 2 illustrate an exemplary structure 100 in accordance with the present invention comprising two wet pits 10, 20 disposed in a substrate 40 with a dry pit 30 disposed between the two wet pits 10, 20. Each wet pit 10, 20, includes a corresponding flat, planar surface 12, 22 that is parallel with an upper substrate surface 15. As provided in the exemplary structure of FIGS. 1 and 2, the flat surfaces 12, 22 may be located at different depths within the substrate 40. For example, the flat surface 22 of the second wet pit 20 may be deeper than flat surface 12 of the first wet pit 10. As provided by the methods described below, the dry pit 30 is desirably etched before the wet pits 10, 20, with the dry pit 30 being coated with a mask layer before the wet pits 10, 20 are etched.

Figure 3:
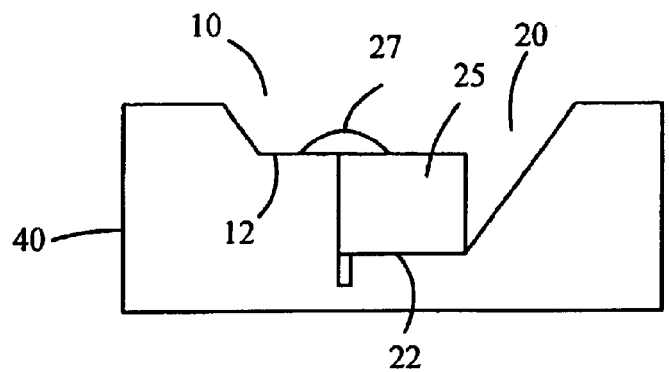
FIG. 3 illustrates the structure of FIG. 2 with a VCSEL disposed on the deeper flat surface.

The structure 100 is particularly useful in an application where a VCSEL or photodetector is disposed on the flat surface 22 of the second wet pit 20, because planar electrical connections 227 (e.g., wire bonds) can be made between the flat surface 12 of the first wet pit 10 and the VCSEL 25, as illustrated in FIG. 3. Planar electrical connections are desirable because they have better characterized impedance characteristics than wire bonds that extend between two different levels.

Figure 4:
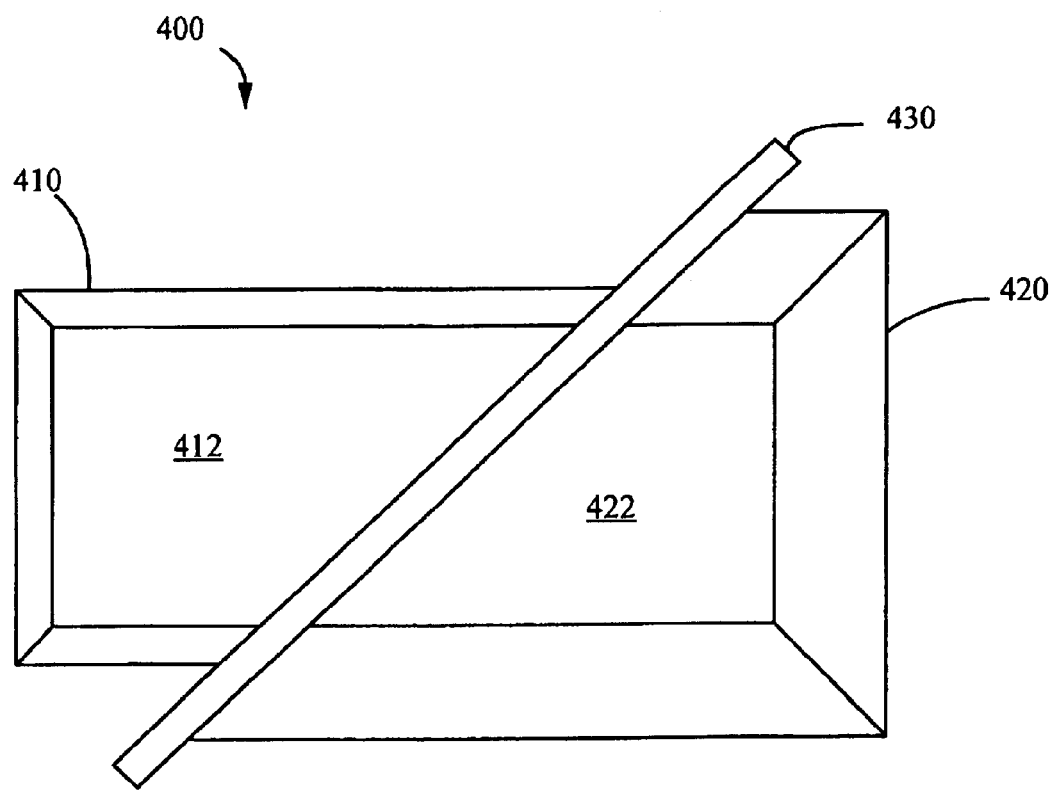
FIG. 4 illustrates a top view of another exemplary structure in accordance with the present invention having two flat, planar surfaces and a linear dry pit disposed between the planar surfaces.
Figure 5:
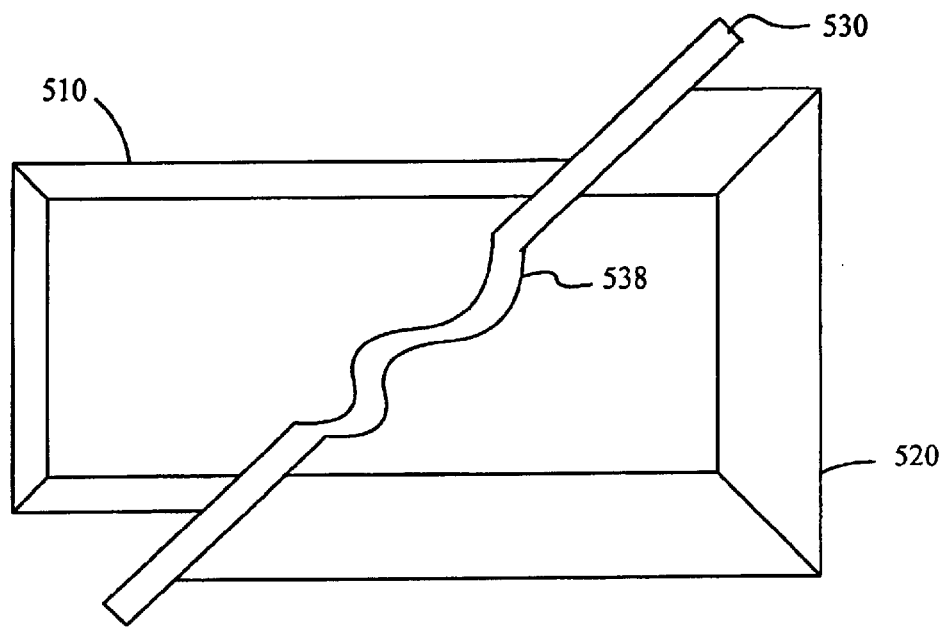
FIGS. 5 and 6 illustrate top views of further exemplary structures in accordance with the present invention having two flat, planar surfaces and a dry pit having curved boundaries disposed between the planar surfaces.
Figure 6:
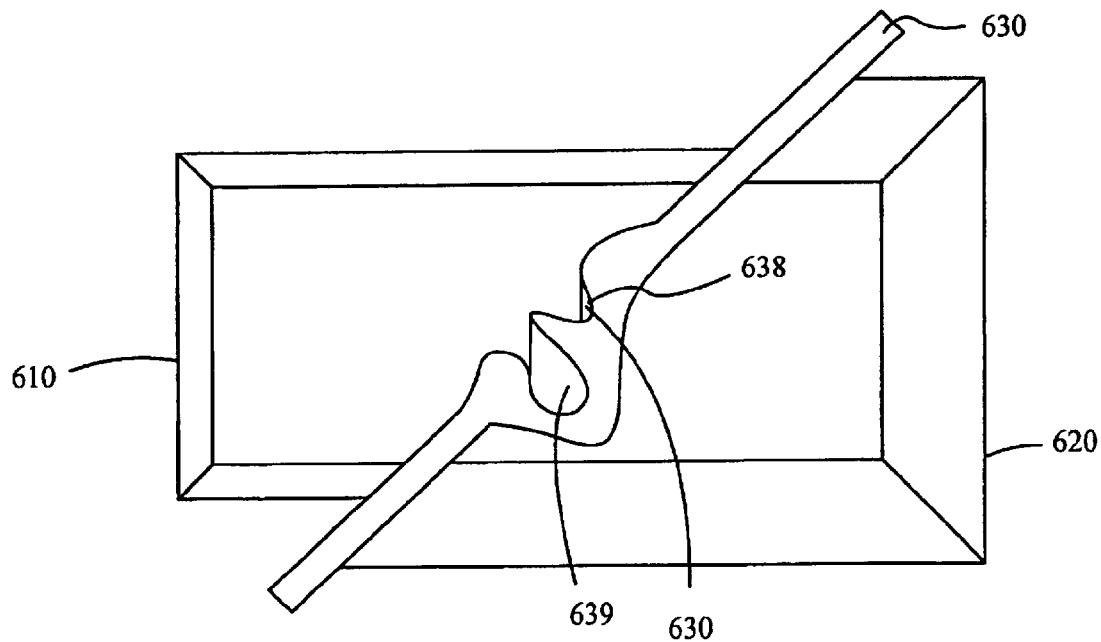

FIGS. 1–3 illustrate a first exemplary structure 100 in accordance with the present invention. However, there are various configurations of dry and wet pits that can provide wet pits that have flat surfaces at different depths. For example, as illustrated in FIG. 4, the dry pit 430 may comprise a straight line trench that is disposed between two wet pits 410, 420 to provide flat surfaces 412, 422 disposed at different depths. The dry pit 430 maybe created by dry-etching or a dicing saw cut, for example. Alternatively, as shown in FIG. 5, the dry pit 530 may comprise curved sidewall portions 538 disposed between two wet pits 510, 520. However, if the curved sidewall portions 638 are too tightly curved, wedges 639 may be formed between the wet pits 610, 620, as illustrated in FIG. 6.

Figure 7:
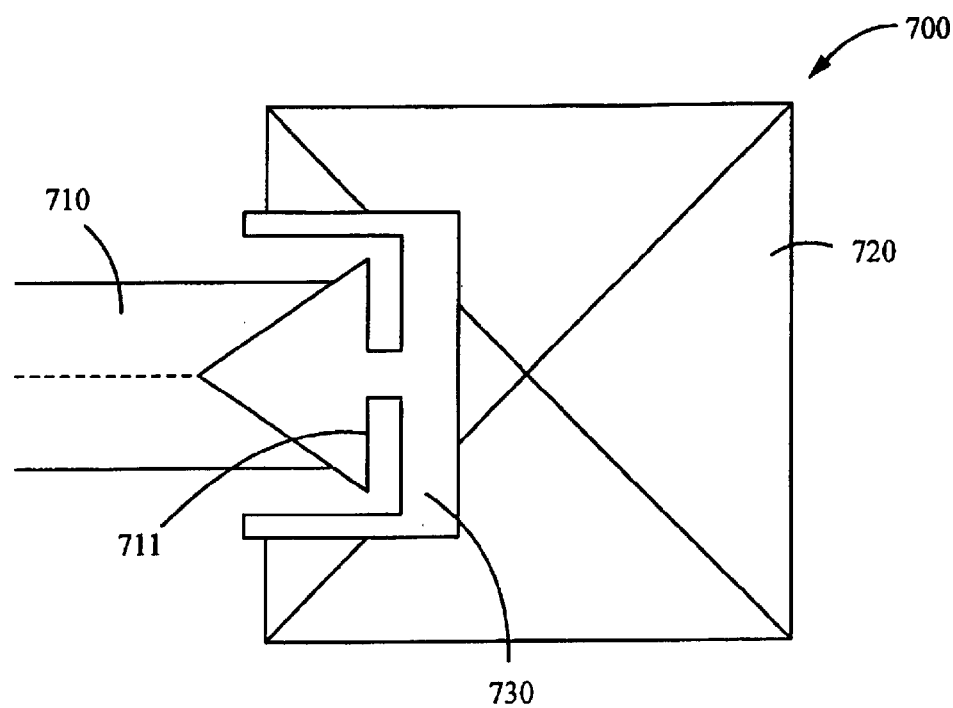
FIG. 7 illustrates a top view of an exemplary structure in accordance with the present invention having a V-groove with a fiber stop and a wet-etched pit for retaining a ball lens.
Figure 8:
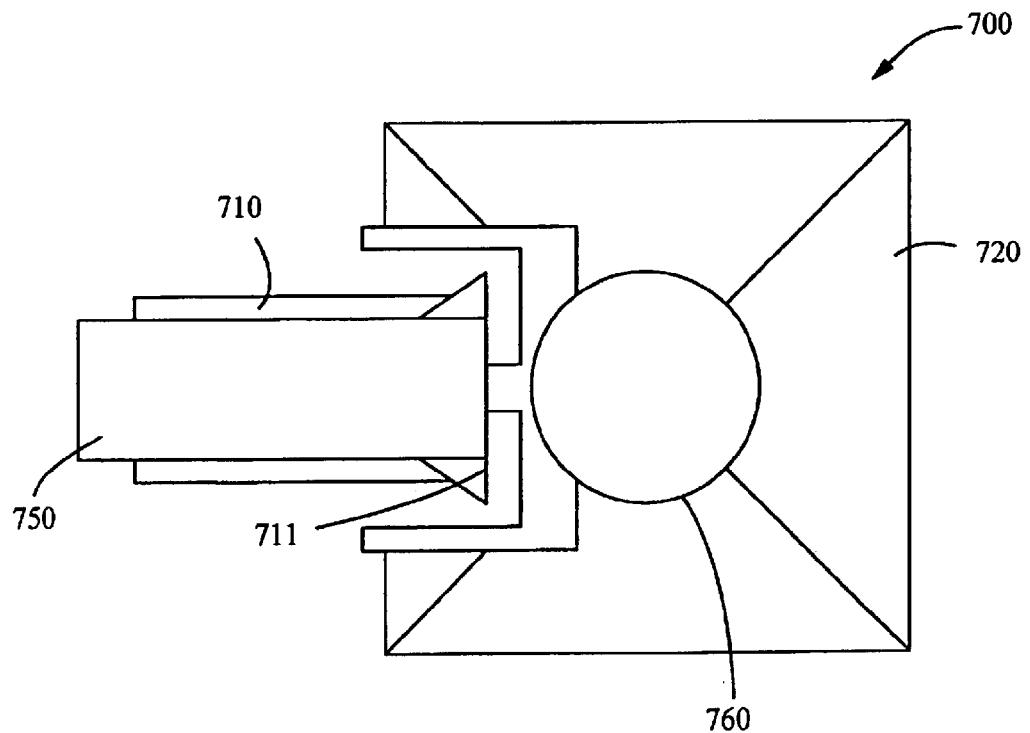
FIG. 8 illustrates a top view of the structure of FIG. 7 with an optical fiber in the V-groove and a ball lens in the pit.

In another aspect of the present invention, a structure 700 for coupling an optical fiber 750 and a ball lens 760 is provided, as illustrated in FIGS. 7 and 8. The structure 700 comprises a V-groove 710 with a fiber stop 711 and a wet-etched pit 720 for a ball lens 760.

Figure 9:
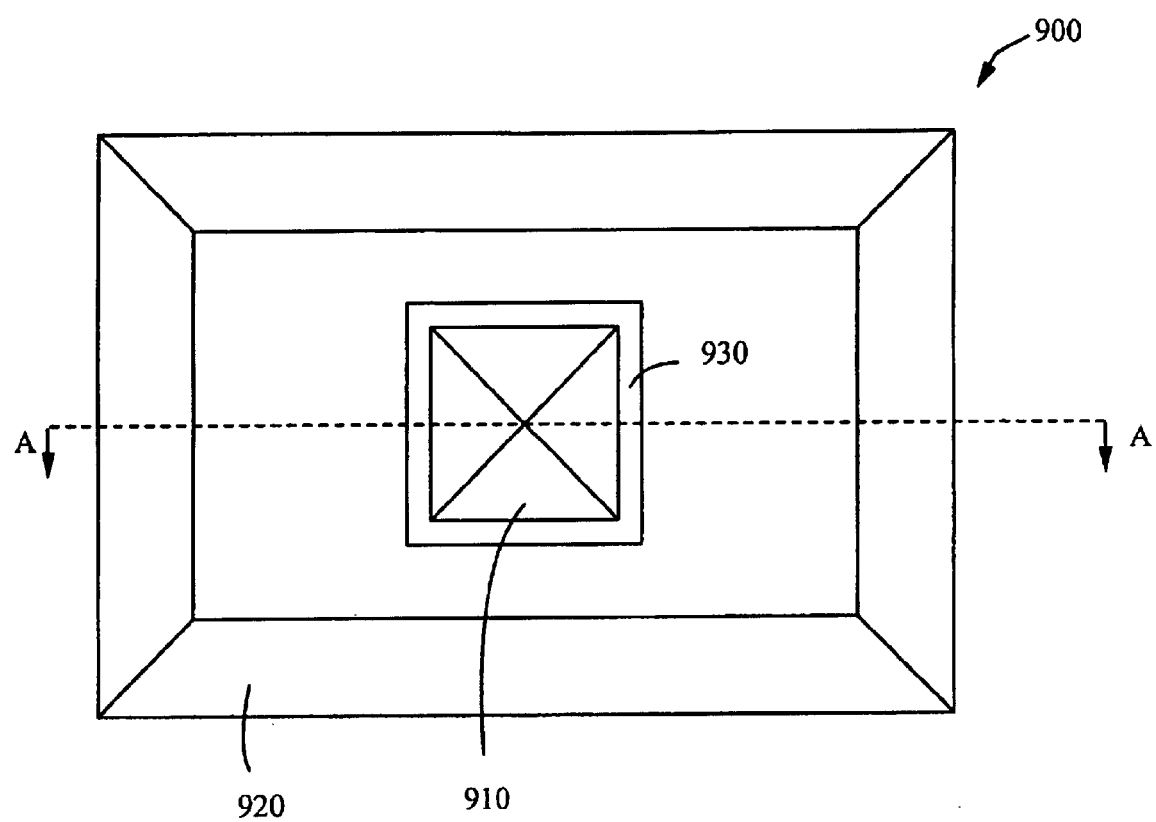
FIGS. 9 and 10 illustrate a top view and a cross-sectional view taken along the line A—A in FIG. 9, respectively, of an exemplary structure in accordance with the present invention having a wet etched pit disposed within another wet etched pit with a ring-shaped dry pit disposed therebetween.
Figure 10:
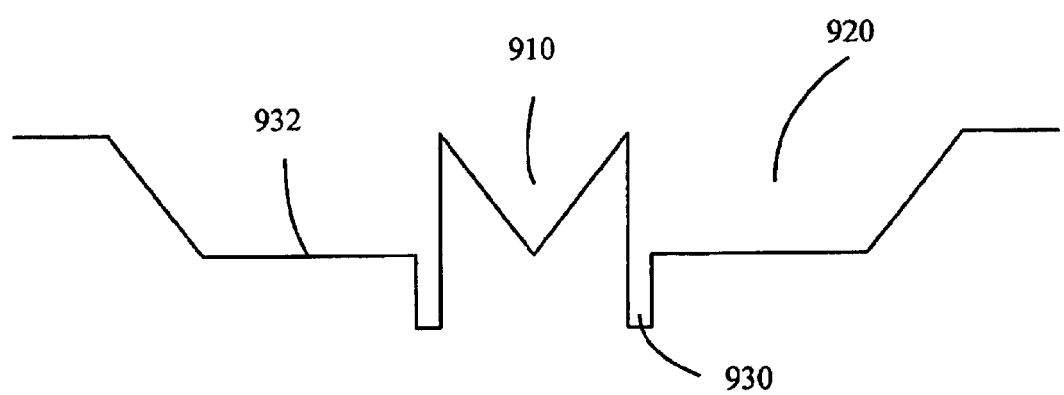

In yet another aspect of the present invention, a structure 900 for use as a silicon optical bench can be provided, as illustrated in FIGS. 9 and 10. An interior wet etched pit 910 can be formed within an exterior wet etched pit 920 with a ring-shaped dry pit 930 disposed therebetween. The exterior wet etched pit 920 can have a flat bottom surface 932. The interior wet pit 910 can hold a ball lens, and the flat bottom surface 932 of the exterior pit 930 can be used to hold optical devices such as switches or fibers.

Figure 11:
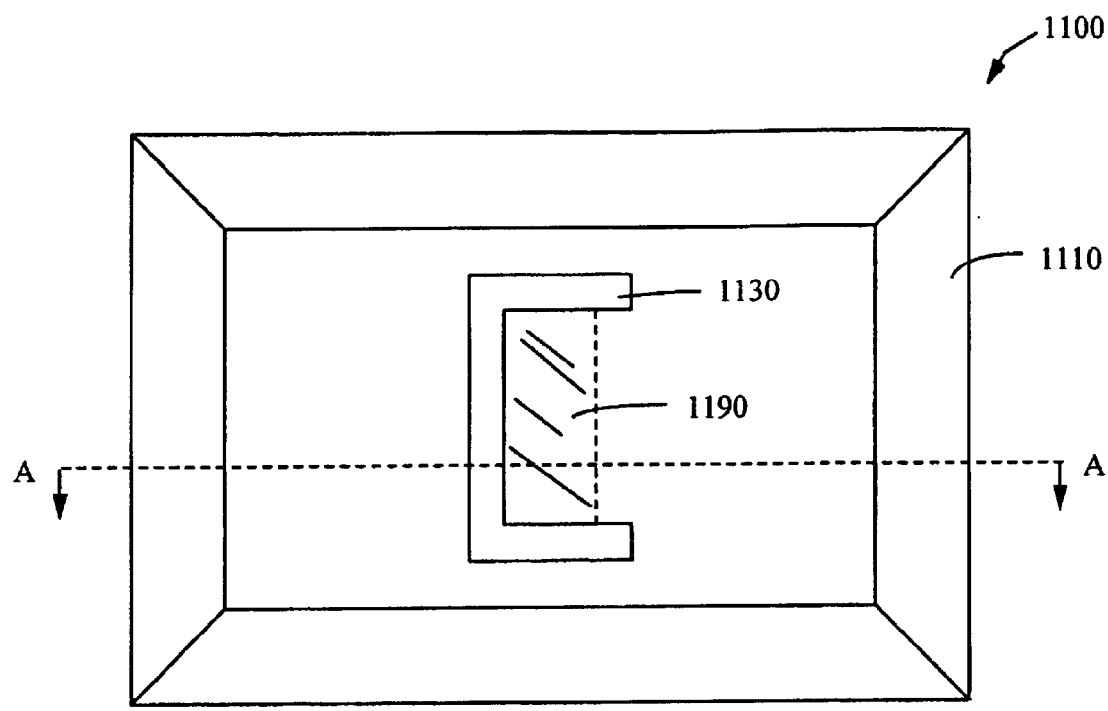
FIGS. 11 and 12 illustrate a top view and a cross-sectional view taken along the line A—A in FIG. 11, respectively, of an exemplary structure in accordance with the present invention having a U-shaped dry pit disposed within a wet etched pit to provide a wedge in the wet edged pit.
Figure 12:
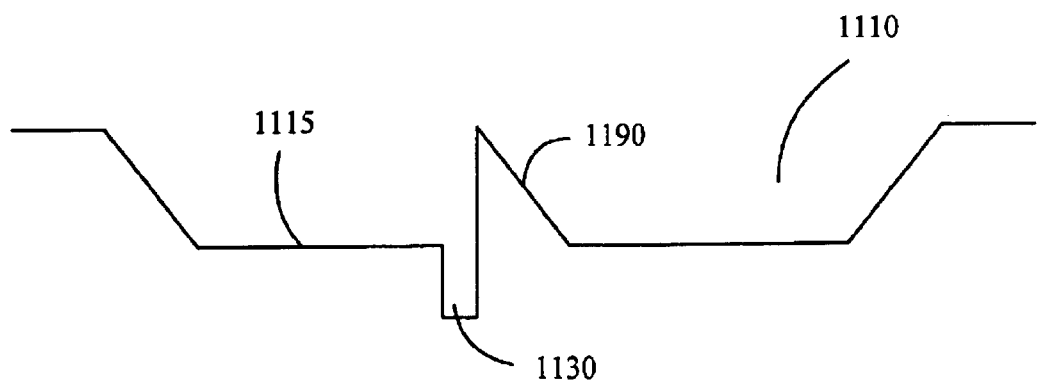
Figure 13:
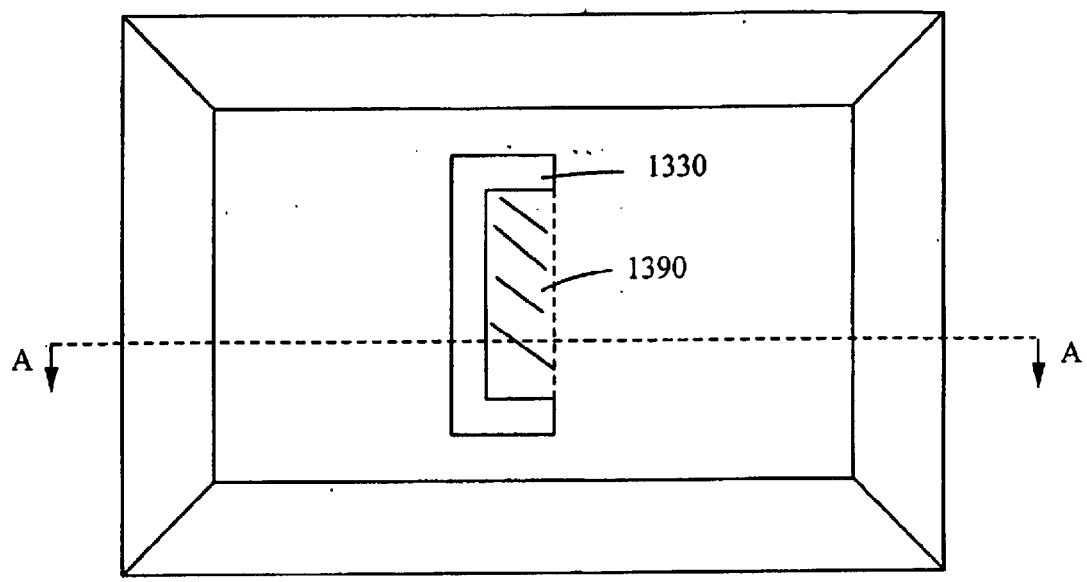
FIGS. 13 and 14 illustrate a top view and a cross-sectional view taken along the line A—A in FIG. 13, respectively, of an exemplary structure in accordance with the present invention having a U-shaped dry pit disposed within a wet etched pit to provide a wedge in the wet edged pit that lies below the surface of the substrate.
Figure 14:
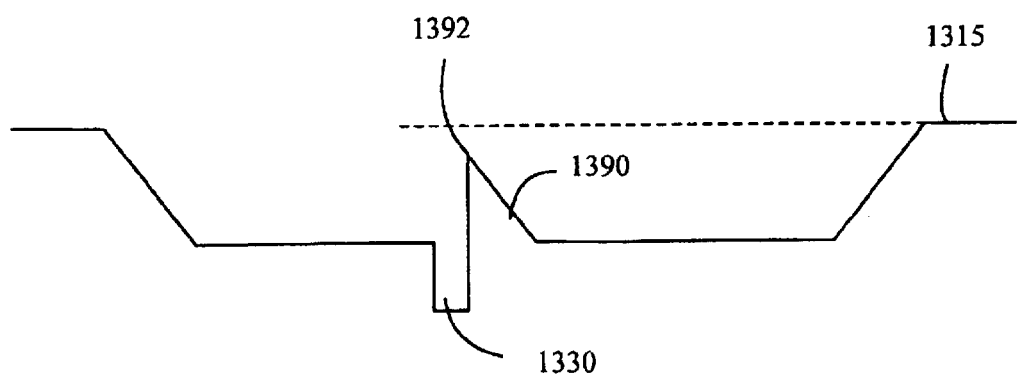
Figure 15:
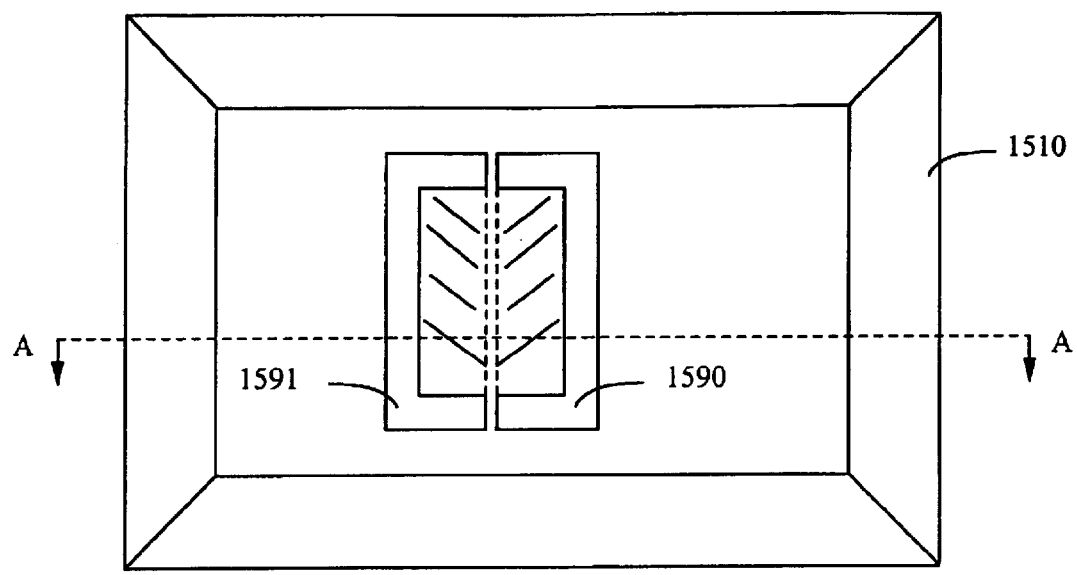
FIGS. 15 and 16 illustrate a top view and a cross-sectional view taken along the line A—A in FIG. 15, respectively, of an exemplary structure in accordance with the present invention having two U-shaped dry pits disposed within a wet etched pit to provide two wedges in the wet edged pit.
Figure 16:
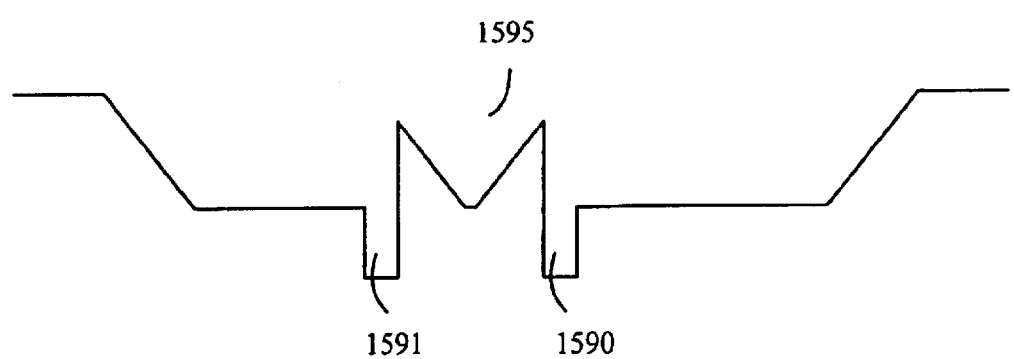

In still another aspect of the present invention, a wedge 1190 is provided on the flat bottom 1115 of a wet etched pit 1110, as illustrated in FIG. 11. In order to form the wedge 1190, a U-shaped dry pit 1130 is dry etched or machined and coated with a hard mask. As illustrated in FIGS. 13 and 14, the U-shaped dry pit 1330 may be shaped so that the size of the wedge 1390 may be limited by the size of the U-shaped pit 1330. In this case, the top corner 1392 of the wedge 1390 will be located below the substrate surface 1315. In yet a further aspect of the invention, multiple U-shaped areas 1590, 1591 can be combined to form a V-groove 1595 or similar shapes in a flat-bottom pit 1510, as shown in FIG. 15.

Figure 17:
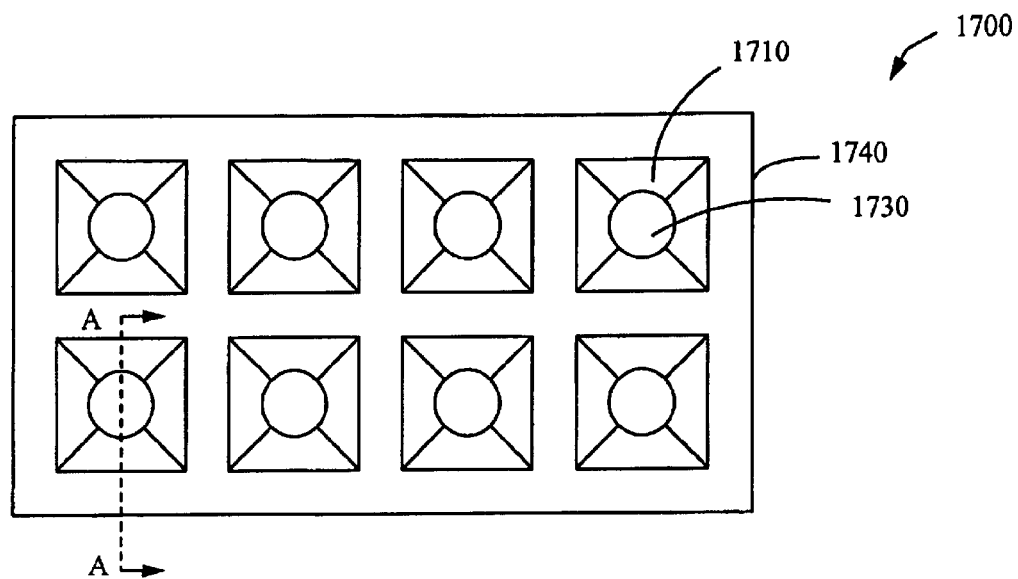
FIG. 17 illustrates a top view of an exemplary structure in accordance with the present invention having a plurality of wet pits each having a micromachined hole disposed therethrough.
Figure 18:
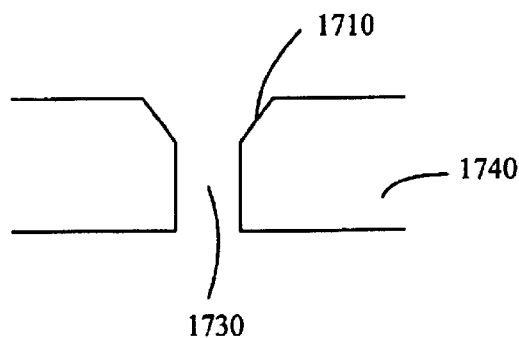
FIG. 18 illustrates a cross-sectional view of one of the wet pits and through-holes of FIG. 17 taken along the line of A—A in FIG. 17.
Figure 20:
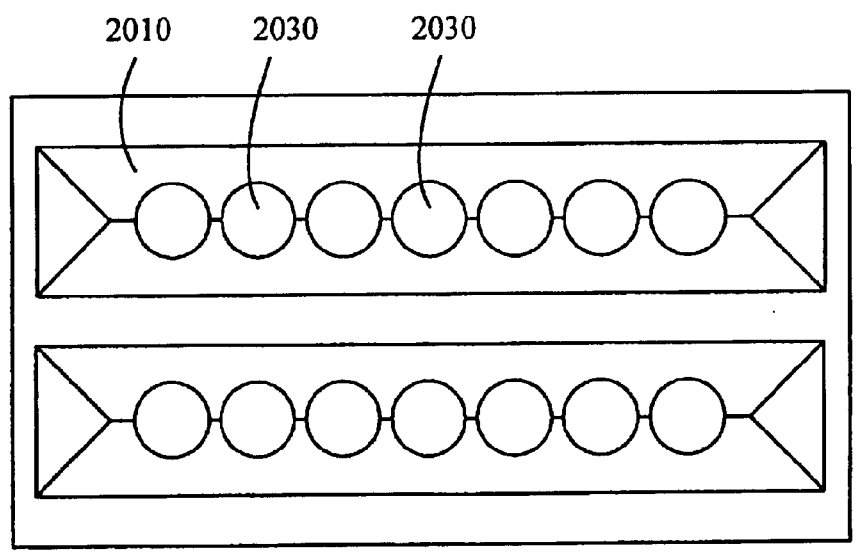
FIG. 20 illustrates a top view of an exemplary structure in accordance with the present invention having V-grooves with a plurality of micromachined holes disposed therethrough.

The present invention also provides a 2-D fiber array 1700, as shown in FIGS. 17 and 18. The fiber array 1700 holes 1730 that are drilled or etched or machined (e.g., by reactive ion etching, ultrasonic drilling, laser drilling, laser machining, or electrodischarge machining) into a substrate 1740. The holes 1730 are then coated with a hard ask material (e.g., $SiO_2$ or Si nitride). Then, the substrate 1740 is wet-etched. The wet etching step can form a wet pit 1710 around each hole 1730. Alternatively, the wet pit can have the shape of a V-groove 2010 and can include a row of holes 2030 disposed therein, as shown in FIG. 20. The V-groove 2010 provides passive alignment in one direction when aligning the optical fibers with the holes 2030.

Figure 19:
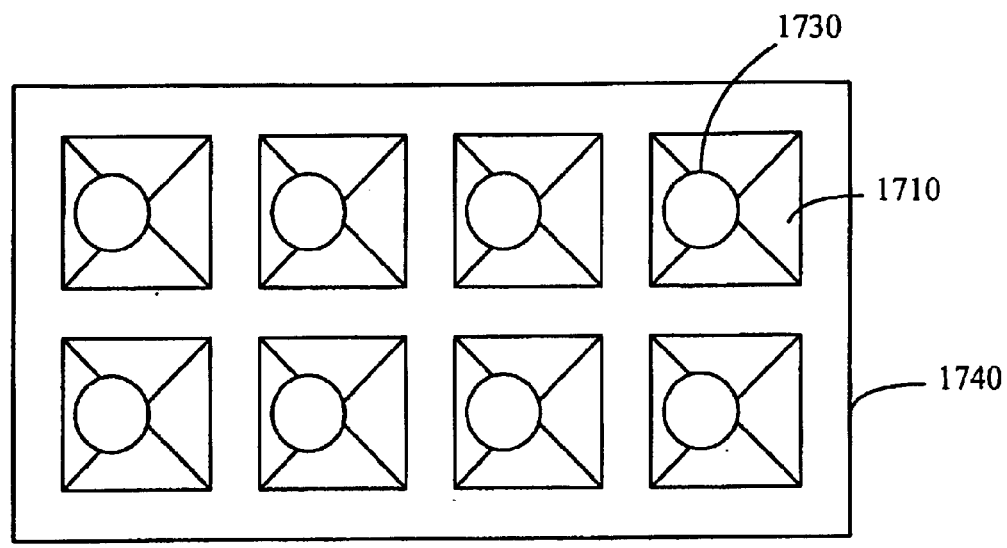
FIG. 19 illustrates a top view of an exemplary structure in accordance with the present invention having a plurality of wet pits each having an off-center micromachined hole disposed therethrough.

The wet pit 1710 associated with each hole 1730 acts as a funnel for guiding an optical fiber into the hole 1730. In this way, the assembly process of a fiber array is simplified. It is noted that the holes 1710 can be located off-center within each wet pit 1730, as shown in FIG. 19. Having off-center holes can be useful for locating the fibers in cases where the fibers are guided into the holes from one direction (e.g., from the right side in FIG. 19).

Figure 21A:
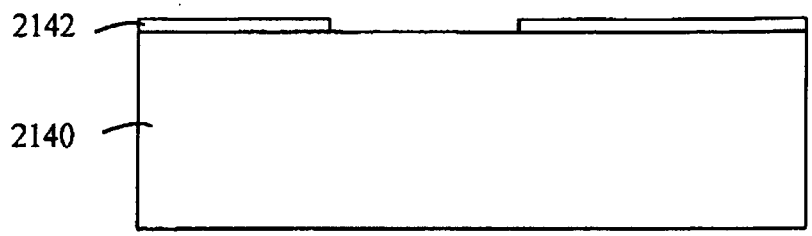
FIGS. 21A–21H illustrate a method for making structures in accordance with the present invention.
Figure 21B:
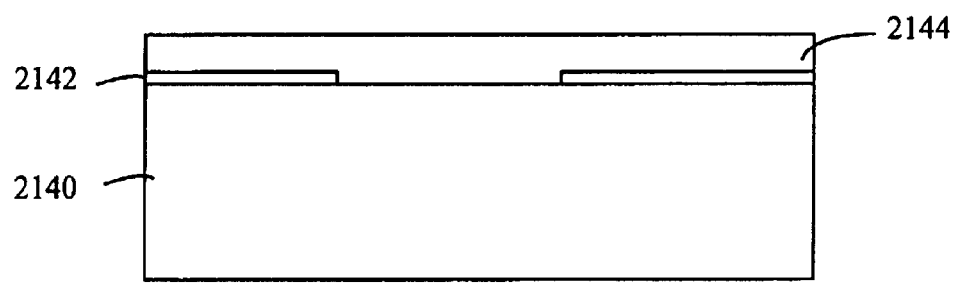
Figure 21C:
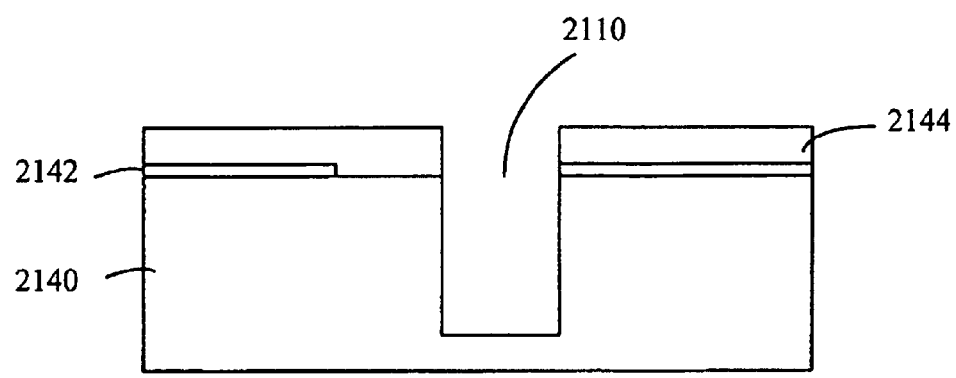
Figure 21D:
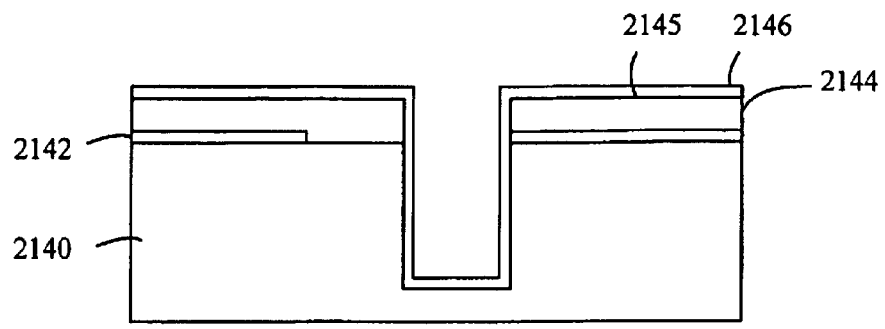
Figure 21E:
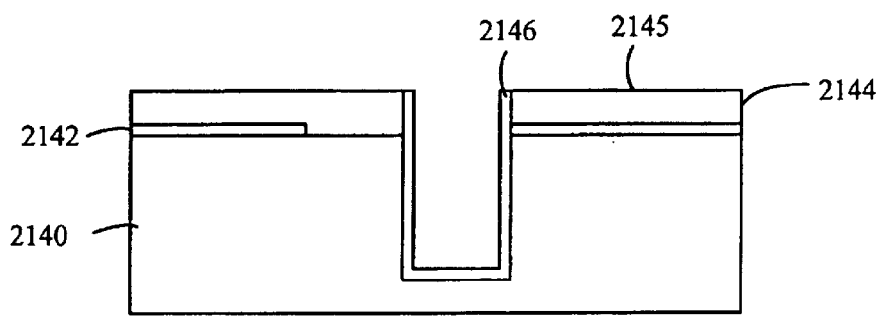
Figure 21F:
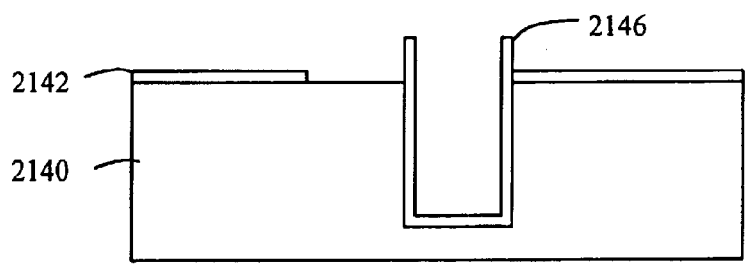
Figure 21G:
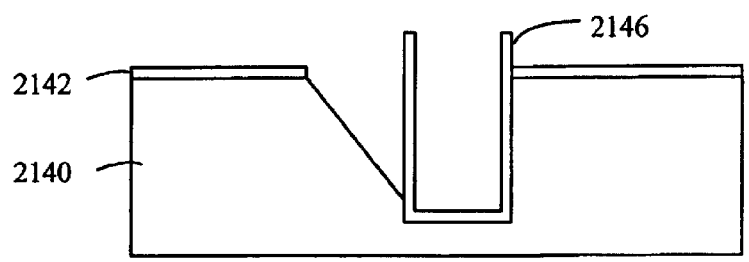
Figure 21H:
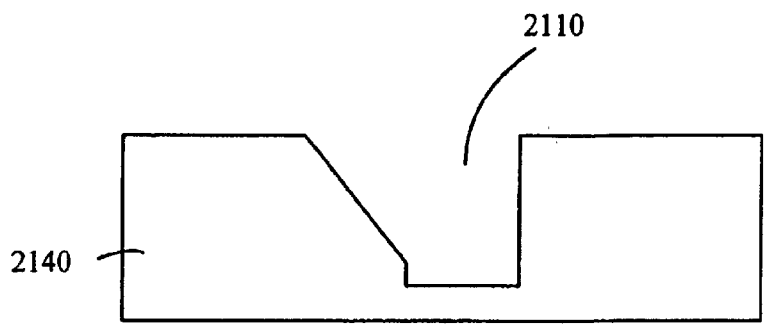

The present invention also provides several methods for creating the above-described structures. For example, with to reference FIGS. 21A–21H, a method in accordance with the present invention is illustrated. First, a hard mask layer 2142 (e.g., nitride) is deposited and patterned on substrate 2140, such as a silicon wafer, FIG. 21A. The hard mask layer 2142 does not cover areas of the substrate 2140 to be wet etched. The hard mask layer 2142 may partially cover areas to be machined (i.e., ultrasonically drilled, electrochemically etched, sawed, etc.), provided that the machining process can remove the hard mask material. Subsequently, a coating 2144 of CVD oxide, PSG or BPSG is provided as shown in FIG. 21B. Then, the machining process is preformed to provide a pit 2110, FIG. 21C. The machining process can be any process that removes substrate material. The machining process should be able to cut through the hard mask layer 2142 and oxide layer 2144. After the machining, a coating of CVD nitride 2146 is provided, as shown in FIG. 21D. Next, nitride 2146 is removed from the top surface 2145 by planarization, FIG. 21E. Then the oxide 2144 is removed by a dilute HF etch, for example, FIG. 21F, and the substrate 2140 is wet etched, FIG. 21G. Finally, hard mask layer 2142 and CVD nitride 2146 is removed, FIG. 21H.

Figure 22A:
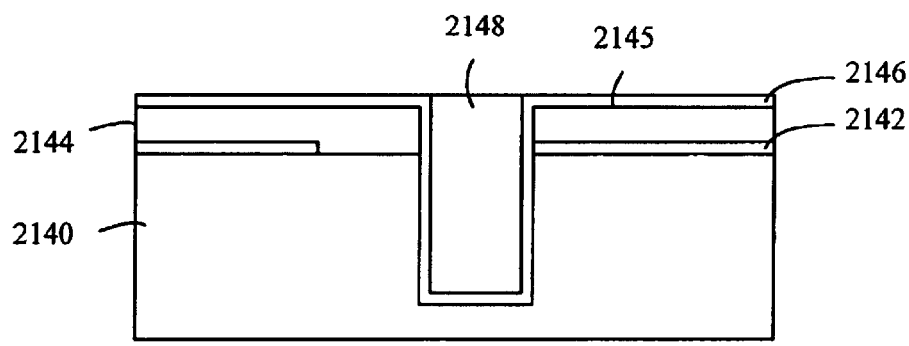
Figure 22B:
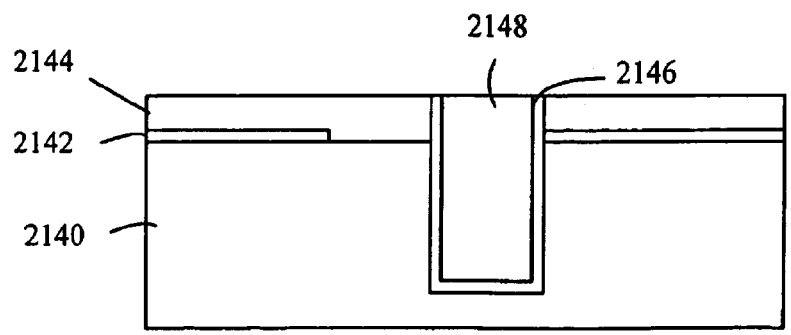
Figure 22C:
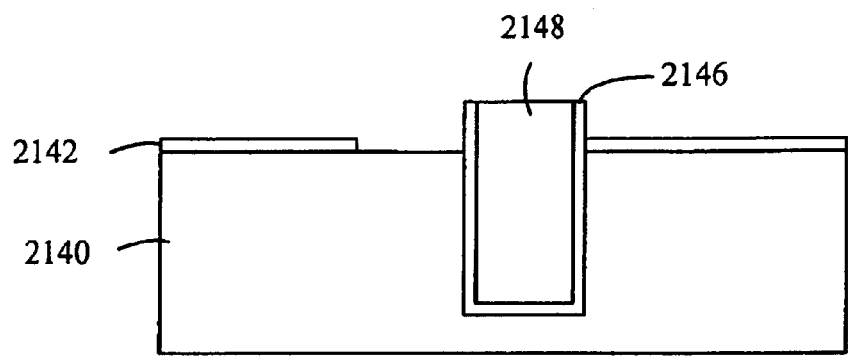
Figure 22D:
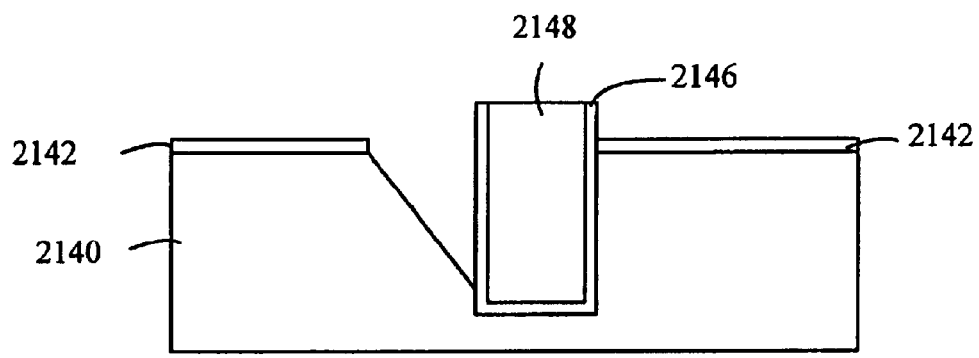
Figure 22E:
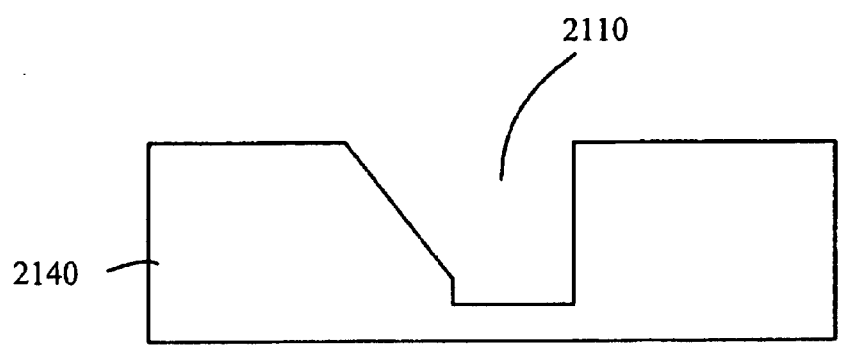

Optionally, after the step of FIG. 21D, the pit 2110 can be filled with a fugitive mask material 2148 that resists nitride etches (e.g., wax, polymer or photoresist), FIG. 22A. After filling the pit 2110, the nitride layer 2146 on th upper surface 2145 is removed by etching, FIG. 22B. Subsequently, the oxide layer 2144 is etched away, FIG. 2C. Then the substrate 2140 is wet etched, FIG. 22D. Finally, the fugitive mask material 2148, nitride layer 2146, and hard mask 2142 are removed, FIG. 22E.

Combined wet and dry etching can be performed according to a number of different methods. The dry pit can be coated with CVD nitride or oxide, or can be thermally oxidized. The present invention can be used with silicon or other materials (e.g., GaAs) that can be dry etched and wet etched (isotropic or anisotropic) and can be conformally coated with a mask material.

For example, referring to FIGS. 23A–23G, another method in accordance with the present invention is provided. First, an $SiO_2$ layer 2342 and a nitride layer 2344 are deposited and patterned over a substrate 2340, such as a silicon wafer, to provide the structure shown in FIG. 23A.

Figure 23A:
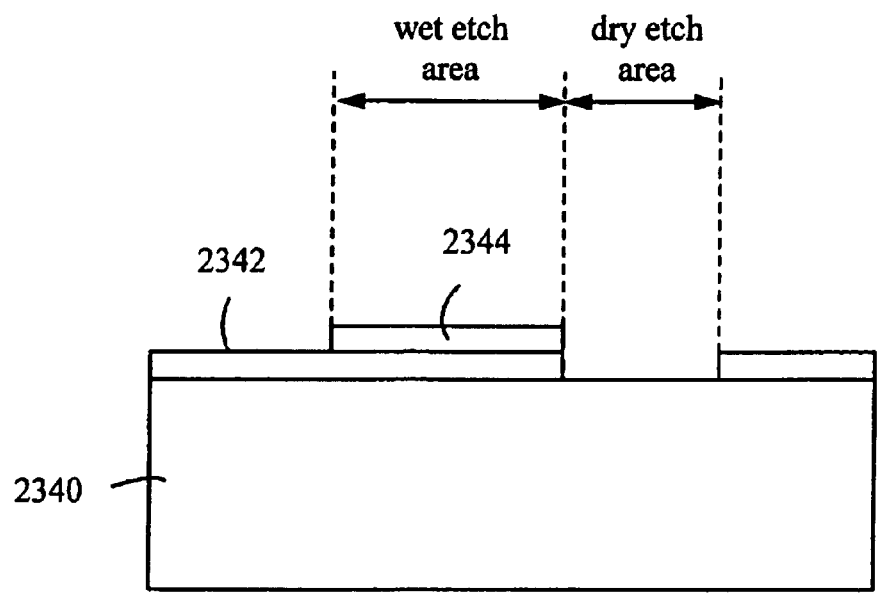
FIGS. 23A–23G illustrate another method for making structures in accordance with the present invention.
Figure 23B:
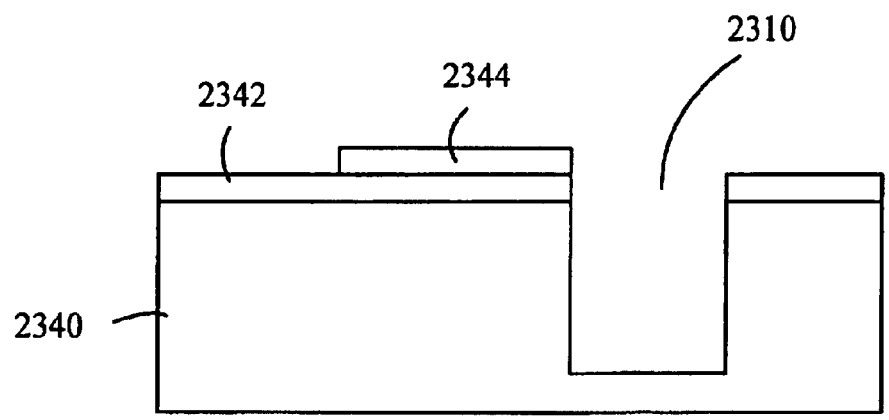
Figure 23C:
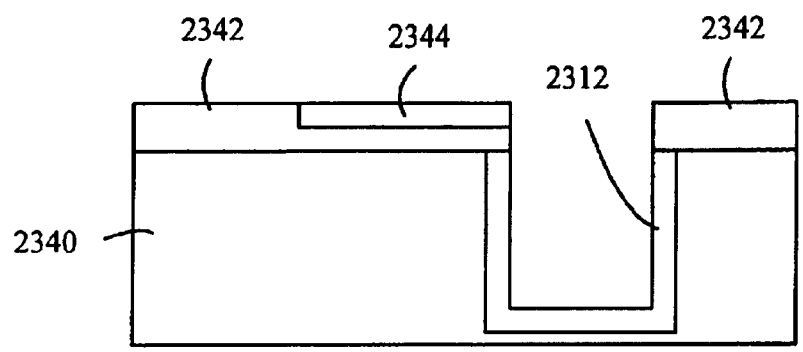
Figure 23D:
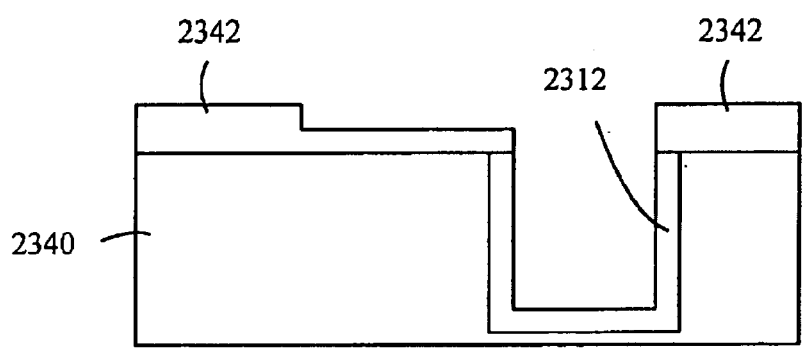
Figure 23E:
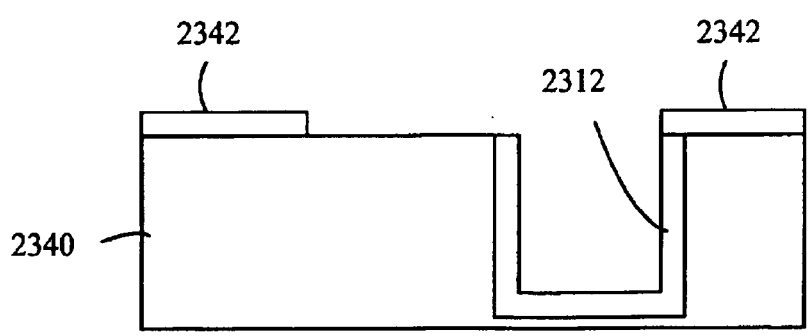
Figure 23F:
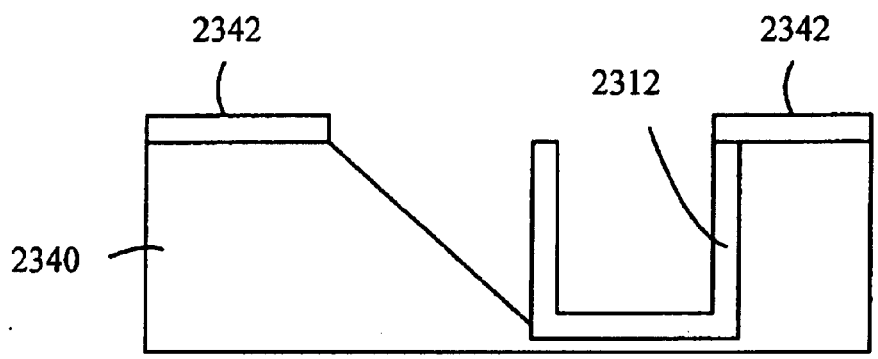
Figure 23G:
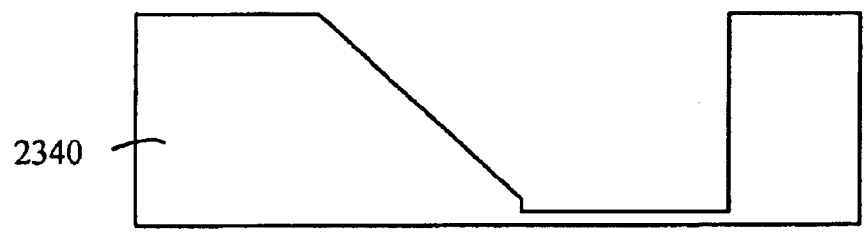

The SiO₂ layer 2342 should be thick enough to serve as a mask during the dry etch step (e.g., the SiO₂ layer 2342 can be about 2 microns thick for a 100 micron deep dry pit 2310). The patterns in the SiO₂ layer 2342 and nitride determine the wet and dry etch areas as shown in FIG. 23A. Next, the dry pit 2310 is formed. The dry pit 2310 can be formed by reactive ion etching, plasma etching, ion milling or any other directional process, FIG. 23B. Then, the substrate 2340 is thermally oxidized to yield the structure shown in FIG. 23C. The sidewalls are necessarily oxidized in this step to provide a sidewall oxide 2312. The thermal oxidization step causes the SiO₂ 2342 to thicken in outside areas outside of the nitride layer 2344. Afterwards, the nitride layer 2344 is removed, FIG. 23D, which can be done with a wet etch. A short duration oxide etch (wet or dry) removes the SiO₂ layer 2342 that was under the nitride layer 2344 to yield the structure shown in FIG. 23E. The other SiO₂ layer areas are not under the nitride layer 2344 remain intact because they are thicker. Next, the substrate 2340 is expose in an anisotropic wet etch to yield the structure shown in FIG. 23F. KOH should not be used because it will attack the SiO₂ layer 2342. EDP or TMAH can be used because they will not attack the SiO₂ layer 2342 as strongly. Then, the SiO₂ layer 2342 and sidewall oxide 2312 are optionally removed, which can be done in a dilute HF etch, FIG. 23G.

Figure 24A:
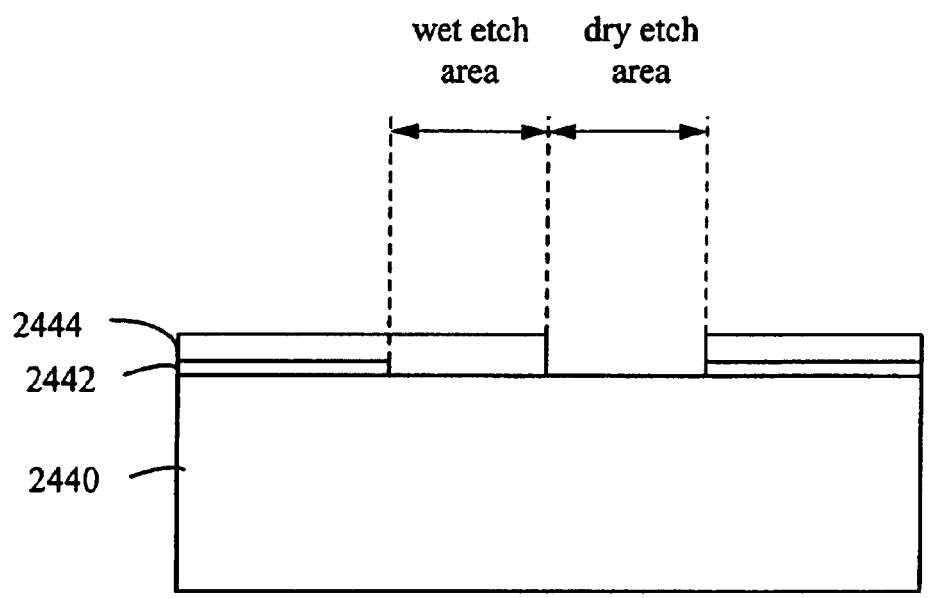
FIGS. 24A–24G illustrate a further method for making structures in accordance with the present invention.
Figure 24B:
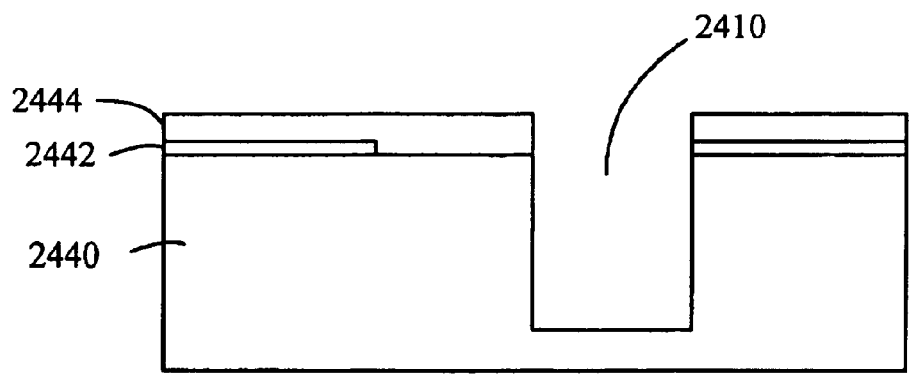
Figure 24C:
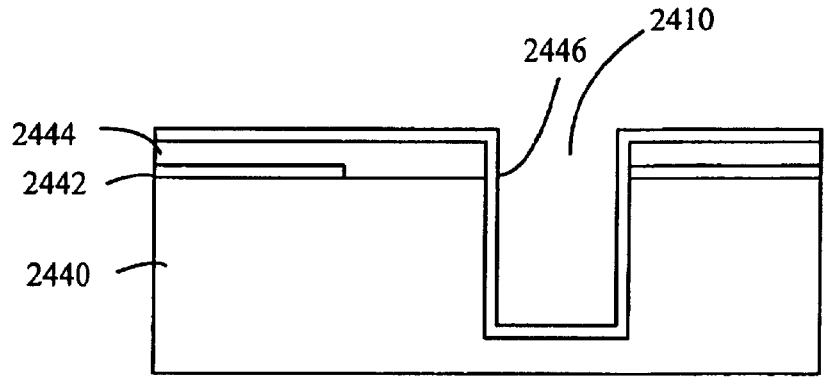
Figure 24D:
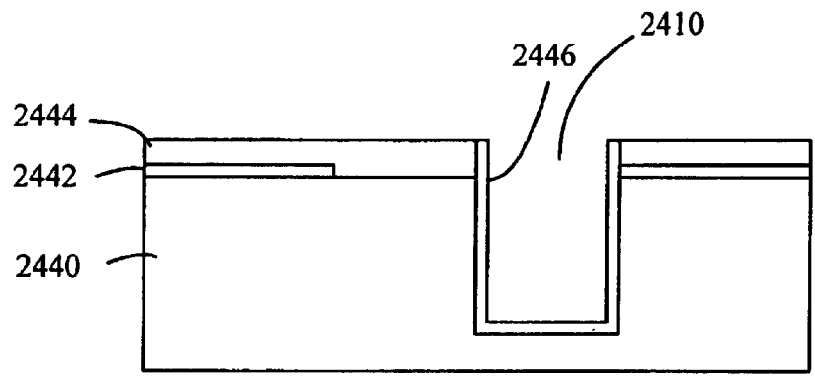
Figure 24E:
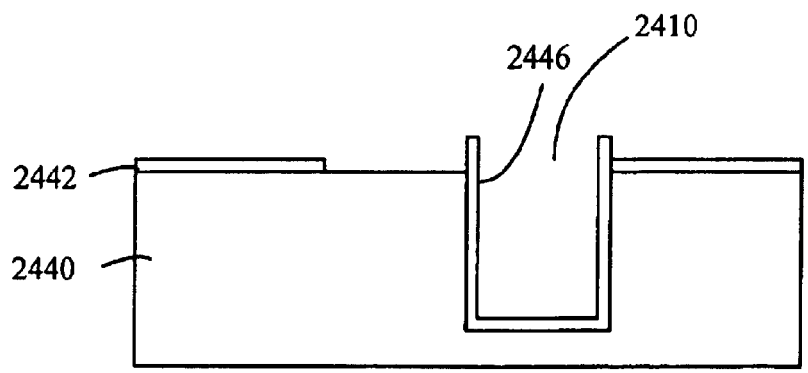
Figure 24F:
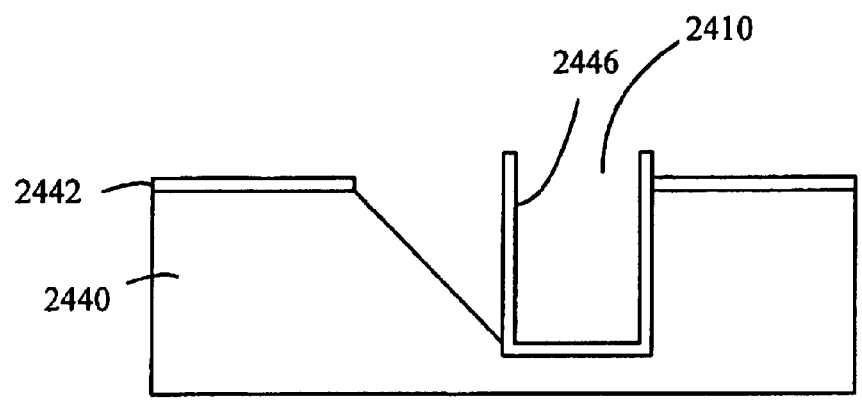
Figure 24G:
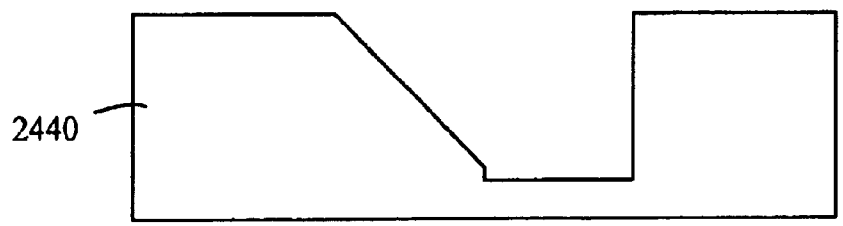

Referring now to FIGS. 24A–24G, yet another method in accordance with the present invention is provided. First, a nitride layer 2442 is deposited and patterned on a substrate 2440, such as a silicon wafer. Then an oxide layer 2444 is deposited and patterned to yield the structure shown in FIG. 24A. The oxide layer 2444 can be thicker than the nitride layer 2442. The oxide layer 2444 can comprise PSG or BPSG, for example. The nitride and oxide patterns determine the wet and dry areas as shown in FIG. 24A. Next, the dry pit 2410 is etched, to yield the structure shown in FIG. 24B, which can be done with RIE, ion milling or similar processes. Then, the substrate is conformally coated with CVD nitride 2446, resulting in the structure of FIG. 24C, where the dry pit 2410 is coated with nitride 2446. The substrate 2440 is then planarized or polished so that CVD nitride 2446 is removed from the top surface, FIG. 24D. Then the oxide layer 2444 is removed, FIG. 24E, which can be done with diluted HF. The exposed areas of the substrate 2440 are then wet etched, to provide the structure shown in FIG. 24F. This can be done with KOH since the mask is made of nitride. Optionally, the nitride layer 2442 and CVD nitride 2446 are removed with etchant that does not damage the silicon, FIG. 24G.

Figure 25A:
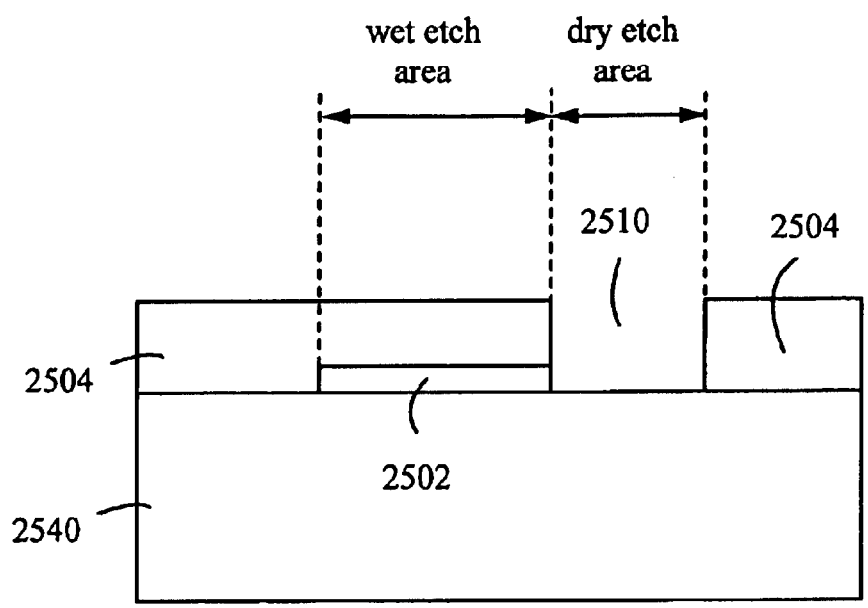
FIGS. 25A–25E illustrate yet a further method for making structures in accordance with the present invention.
Figure 25B:
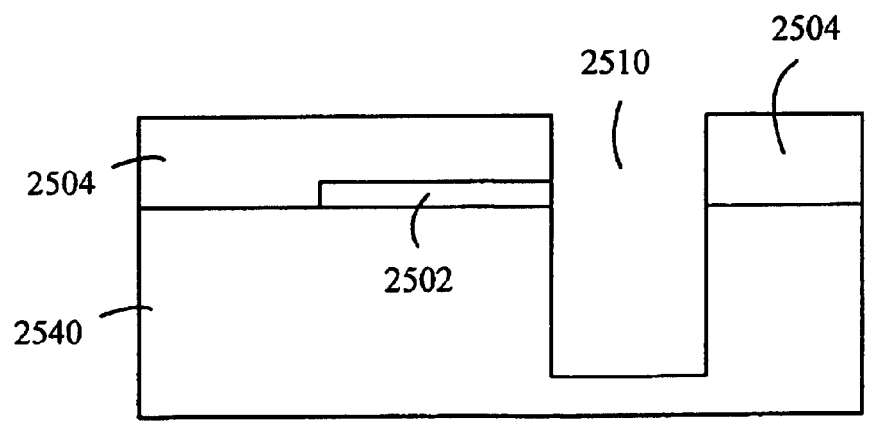
Figure 25C:
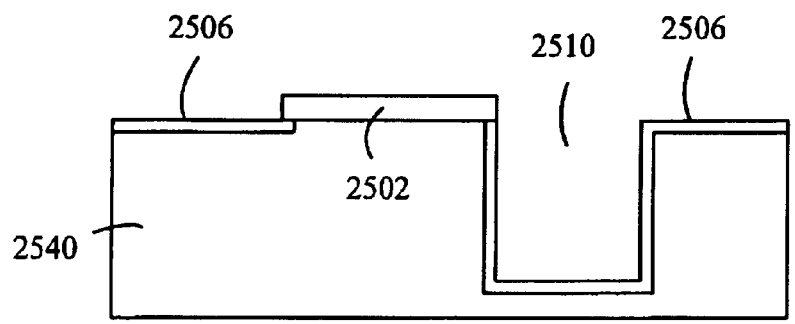
Figure 25D:
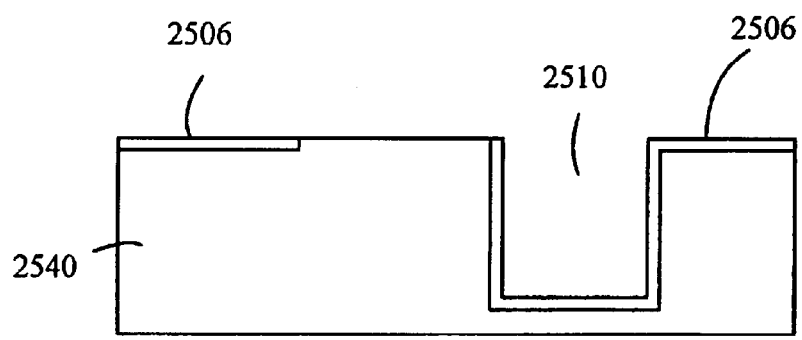
Figure 25E:
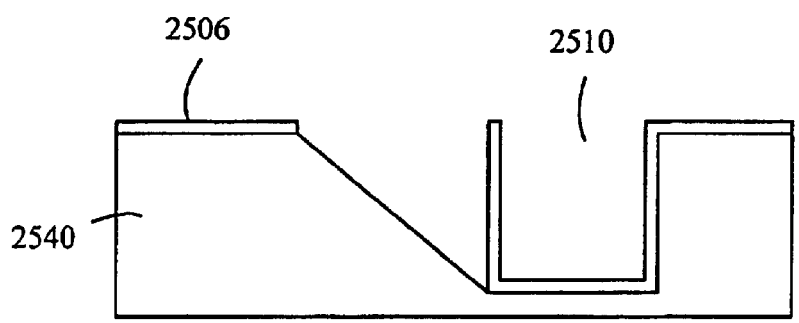

Referring now to FIGS. 25A–25G, still another method in accordance with the present invention is provided. A hard mask layer 2504 that blocks oxide formation (e.g., silicon nitride) is deposited and patterned over a substrate 2540, such as a silicon wafer, followed by depositing and patterning a photoresist layer 2504, resulting in the structure of FIG. 25A with the dry and wet etch areas defined as shown. The photoresist layer 2504 does not need to cover the entire hard mask layer 2504. The portion of the substrate 2540 exposed by the photoresist layer 2504 and hard mask layer 2504 is dry etched, FIG. 25B. Then the photoresist layer 2504 is removed and the substrate 2540 oxidized to provide an oxide layer 2506, as shown in FIG. 25C. Oxide will not grow under the hard mask layer 2502. Next, the hard mask layer 2502 is removed, FIG. 25D. Subsequently, the substrate 2540 is wet-etched with an anisotropic etchant, resulting in the structure of FIG. 25E. Optionally, the oxide layer 2506 can be removed after the wet etch.

These and other advantages of the present invention will be apparent to those skilled in the art form the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A micromachined structure, comprising:
   a substrate;
   a first wet-etched pit disposed in the substrate;
   a second wet-etched pit disposed in the substrate, the second wet-etched pit extending into the substrate a greater depth than the first wet-etched pit and comprising a flat surface parallel to the upper surface of the substrate; and
   a dry-etched pit disposed between, and adjacent to, the first and second wet-etched pits.

2. The micromachined structure of claim 1, wherein the substrate comprises <100> silicon.

3. The micromachined structure of claim 1, wherein the first wet-etched pit comprises a flat surface parallel to the upper surface of the substrate.

4. The micromachined structure of claim 3, comprising at least one of a VCSEL or a photodetector mounted to the flat surface of the second wet-etched pit.

5. A micromachined structure comprising:
   a substrate;
   a first wet-etched pit disposed in the substrate;
   a second wet-etched pit disposed in the substrate, the second wet-etched pit extending into the substrate a greater depth than the first wet-etched pit; and
   a dry-etched pit disposed between, and adjacent to, the first and second wet-etched pits;
   wherein the dry-etched pit is disposed within the second wet-etched pit and wherein the dry-etched pit circumscribes the first wet-etched pit.

6. The micromachined structure of claim 1, wherein the first wet-etched comprises a V-shaped cross-section.

7. A micromachined structure comprising:
   a substrate;
   a first wet-etched pit disposed in the substrate;
   a second wet-etched pit disposed in the substrate, the second wet-etched pit extending into the substrate a greater depth than the first wet-etched pit; and
   a dry-etched pit disposed between, and adjacent to, the first and second wet-etched pits;
   wherein the first wet-etched pit comprises a V-shaped cross-section and the second wet-etched pit comprises a pyramidal pit.

8. The micromachined substrate of claim 7, comprising a ball lens disposed in the second wet-etched pit and an optical fiber disposed in the first wet-etched pit.

9. The micromachined structure of claim 1, wherein the dry-etched pit is a linear trench.

* * * * *